(12) United States Patent
Saito et al.

(10) Patent No.: US 6,437,253 B1
(45) Date of Patent: Aug. 20, 2002

(54) TERMINAL STRUCTURE TO WHICH AN ELECTRONIC COMPONENT IS TO BE BONDED

(75) Inventors: Hirokazu Saito, Ome; Kazuhiro Sugiyama, Kunitachi, both of (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 09/503,231

(22) Filed: Feb. 11, 2000

(30) Foreign Application Priority Data

Mar. 16, 1999 (JP) .......................... 11-069939

(51) Int. Cl.⁷ ........................ H01R 12/04; H05K 1/11
(52) U.S. Cl. ........................ 174/261; 174/260
(58) Field of Search .................. 174/261, 260; 361/767–779

(56) References Cited

U.S. PATENT DOCUMENTS

| | | | |
|---|---|---|---|
| 5,378,859 A | | 1/1995 | Shirasaki et al. ........... 174/261 |
| 5,428,505 A | * | 6/1995 | Sakemi et al. .............. 361/777 |
| 5,453,582 A | * | 9/1995 | Amano et al. .............. 174/261 |

* cited by examiner

Primary Examiner—Jeffrey Gaffin
Assistant Examiner—Jeremy Norris
(74) Attorney, Agent, or Firm—Frishauf, Holtz, Goodman, Langer & Chick, P.C.

(57) ABSTRACT

Connection terminals are provided on the upper surface of a film substrate. Each terminal comprises an electrodeconnecting part and a circular reinforcing part connected to the distal end of the electrode-connecting part. Connection electrodes are provided at a predetermined pitch P on the lower surface of a semiconductor chip. The side length L of the connection electrodes and the pitch P may be reduced to accomplish fine pitching. In this case, the width T of the connection terminal is decreased to some extent, in consideration of the bonding precision. In spite of this, the reinforcing part of each connection terminal hardly peels from the film substrate if it has a diameter that is equal to the length L of the side of the connection electrode.

21 Claims, 6 Drawing Sheets

TERMINAL STRUCTURE TO WHICH AN ELECTRONIC COMPONENT IS TO BE BONDED

BACKGROUND OF THE INVENTION

The present invention relates to a terminal structure to which an electronic component such as a semiconductor chip is to be bonded.

Some types of liquid crystal displays, for example, comprise a liquid display panel, a circuit board for supplying data and control signals to the liquid crystal panel, and a flexible wiring board connecting the liquid crystal panel and the circuit board. The flexible wiring board may be one called COF (Chip On Film) that comprises a film substrate and a semiconductor chip mounted on the film substrate. The semiconductor chip is, for example, an LSI for driving the liquid crystal panel.

Such a conventional flexible wiring board has connection terminals provided on the upper surface of the film substrate and connection electrodes provided on the lower surface of the semiconductor chip. FIG. 8 shows the positional relation between the connection terminals and the connection electrodes. The connection terminals 1 have been formed by etching a copper foil or the like laminated with the film substrate (not shown) by direct deposition or using adhesive. They are straight, arranged parallel to one another and spaced at a predetermined pitch. The connection electrodes 2 (bump electrodes), which are provided on the lower surface of the semiconductor chip, are square in cross-section, arranged side by side and spaced at the same pitch as the connection terminals 1. The electrodes 2 are connected to the connection terminals 1 by an anisotropic, electrically conductive adhesive (not shown). The semiconductor chip is thereby mounted on the film substrate.

Each side of the square connection electrodes 2 has a length L, and the connection electrodes 2 are arranged at pitch P. The gap D between any two adjacent connection electrodes 2 is therefore (P−L). Assume that the precision of bonding the semiconductor chip to the film substrate is ±A. Then, it is necessary to prevent each connection terminal 1 from being displaced to have its one edge coming out of the left or right side of one connection electrode 2. To this end, the width T of the connection terminals 1 must be (L−2A) at maximum. That is, in view of the bonding precision of ±A, the width T must be (L−2A) at maximum in order to reduce the side length L of the connection electrodes 1 and the pitch P thereby to achieve fine pitching. Consequently, the width T of the connection terminals 1 is far less than the side length L of the connection electrodes 2. The peeling strength that the terminals 1 have with respect to the film substrate is inevitably small. Particularly, the end portions of each connection terminal 1 are likely to peel from the film substrate. There are inevitably limitations to the fine pitching.

BRIEF SUMMARY OF THE INVENTION

The object of the present invention is to provide a terminal structure to which an electronic component can be bonded with high adhesion strength even if the terminals are arranged at a short pitch.

The terminal structure according to this invention comprises a substrate and a plurality of connection terminals. The connection terminals are arranged on the substrate at a predetermined pitch. Each connection terminal has an electrode-connecting part and a reinforcing part. The electrode-connecting part has a predetermined width. The reinforcing part is provided near the electrode-connecting part and has a maximum width greater than the width of the electrode-connecting part.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
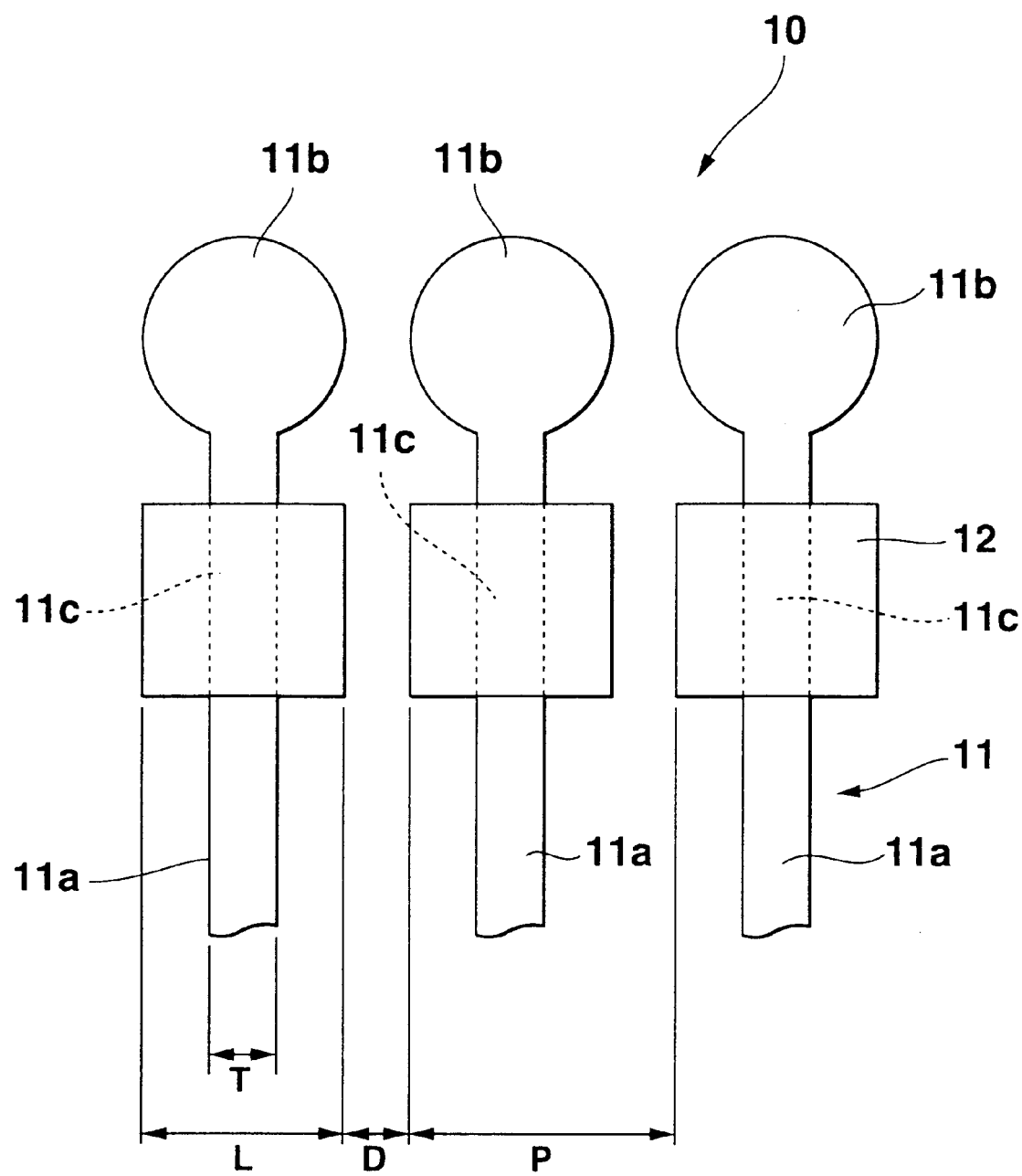
FIG. 1 is a magnified plan view showing a terminal structure according to the first embodiment of the invention, to which a semiconductor chip is bonded, and illustrating the position relation between connection terminals provided on the upper surface of a film substrate and connection electrodes provided on the lower surface of the semiconductor chip.

FIG. 1 shows a flexible wiring board 10 according to the first embodiment of the present invention. The flexible wiring board 10 comprises a film substrate and connection terminals 11 provided on the upper surface of the film substrate. More specifically, FIG. 1 illustrates the positional relation that the connection terminals 11 have with respect to connection electrodes 12 provided on the lower surface of a semiconductor chip. The connection terminals 11 have been formed by etching an electrically conductive film, such as a copper foil, formed directly on the film substrate (see FIGS. 2 and 3). The connection terminals 11 may be efficiently formed as follows. First, a first film of metal such as copper is formed to a thickness of thousands of angstroms by means of sputtering or electroless plating. Next, a second film of the same metal is formed on the first film to a thickness of 5 to 20 µm by means of electrolytic plating, thereby forming a two-layer film. Finally, the two-layer film is patterned by the well-known photolithography.

The connection terminals 11 are arranged at a predetermined pitch. Each connection terminal 11 comprises a straight main part 11a and a circular reinforcing part 11b. The reinforcing part 11b is formed integral with one end of the main part 11a. That portion of the main part 11a which is adjacent to the reinforcing part 11b is an electrode-connecting part 11c to which one connection electrode 12 of a semiconductor chip is to be bonded as will be described later.

Connection electrodes 12 (bump electrodes) are provided on the lower surface of the semiconductor chip (later describe with reference to FIGS. 2 and 3). The connection electrodes 12 are substantially square. The electrodes 12 are arranged side by side and spaced at the same pitch as the connection terminals 11. The electrodes 12 are bonded to the electrode-connecting parts 11c of the connection terminals 11, respectively, with solder or the like.

Each side of the square connection electrodes 12 has a length L, and the connection electrodes 12 are arranged at pitch P. The gap D between any two adjacent connection electrodes 2 is therefore (P–L). Assume that the precision of bonding the semiconductor chip to the film substrate is ±A. Then it is necessary to prevent each connection terminal 11 from being displaced to have its one edge coming out of the left or right side of one connection electrode 12. To this end, the width T of the connection terminals 1 must be (L–2A) at maximum. The side length L of the connection electrodes 12 and the pitch P may be reduced to accomplish fine pitching. In this case, the width T of the connection terminal 11 is decreased to (L–2A) in consideration of the bonding precision of ±A. Notwithstanding this, the reinforcing part 11b of each connection terminal 11 hardly peels from the film substrate if it has a diameter (maximum width) that is almost equal to the length L of the side of the connection electrode 12. This can achieve better fine pitching.

Figure 2:
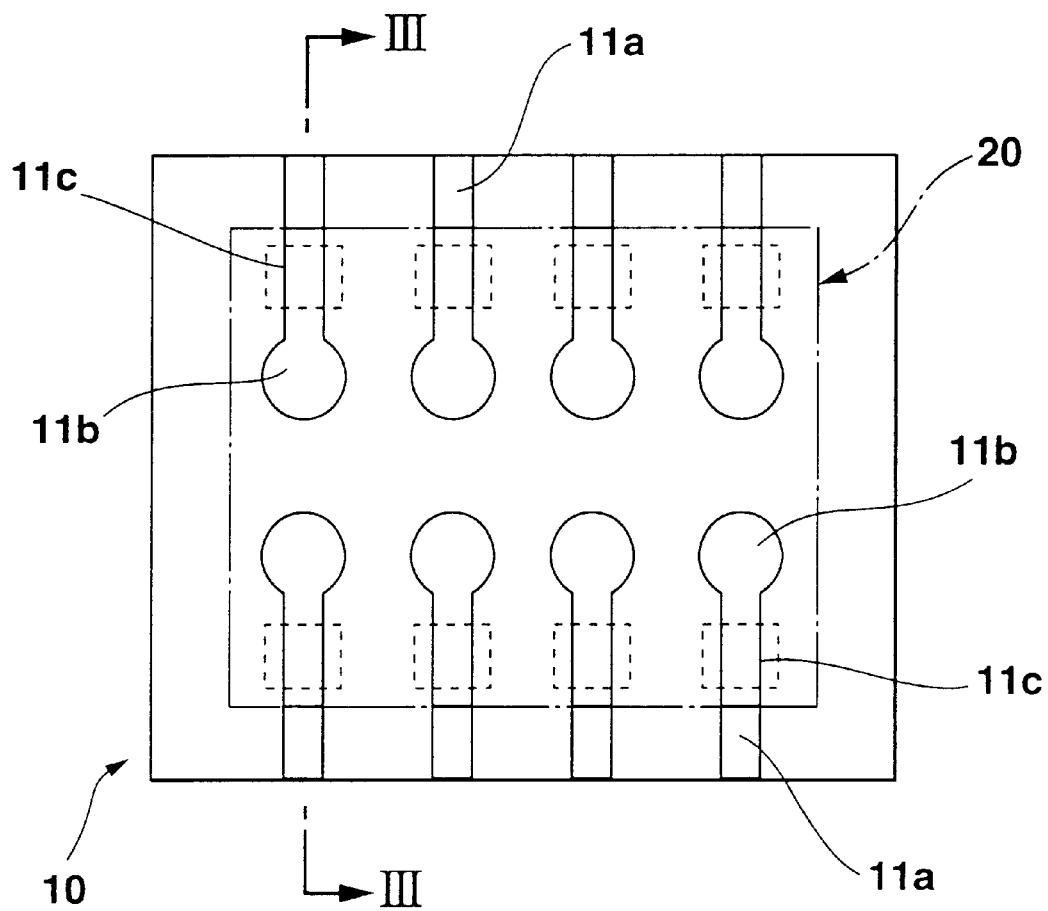
FIG. 2 is a plan view showing a semiconductor chip bonded to a film substrate in a specific manner.
Figure 3:
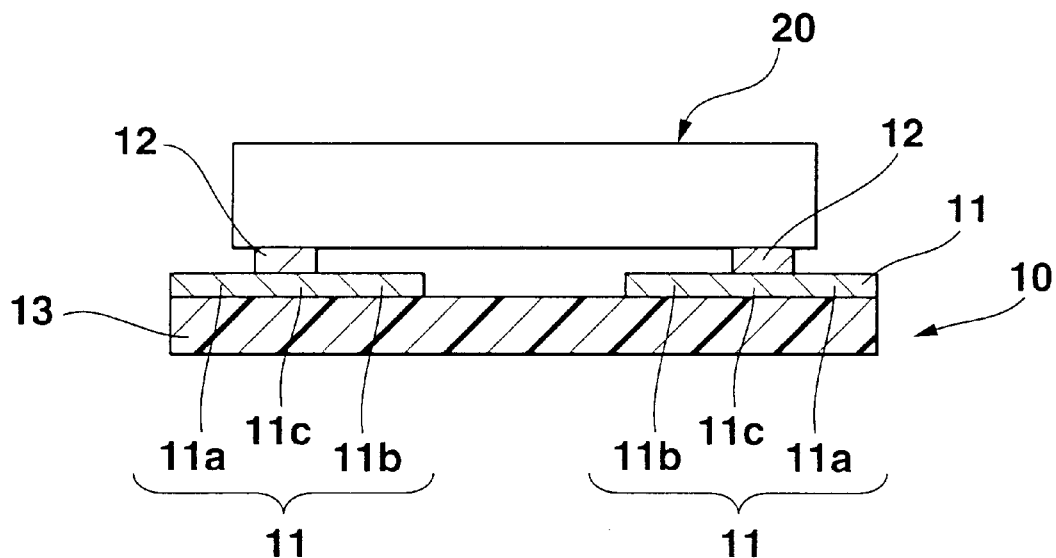
FIG. 3 is a sectional view taken along line III—III in FIG. 2.

FIG. 2 is a plan view showing a semiconductor chip 20 bonded to a flexible wiring board 10 of the structure described with reference to FIG. 1. FIG. 3 is a sectional view taken along line III—III in FIG. 2.

As shown in FIG. 2, the semiconductor chip 20, which is indicated by one-dot dashed lines, has two rows of connection electrodes 12 spaced apart from one another. The first row is provided on a long-side edge of the chip 20. The second row is provided on the other long-side edge of the chip 20. As seen from FIG. 3, the flexible wiring board 10 comprises a film substrate 13 and a plurality of connection terminals 11. The film substrate 13 is made of polyimide or the like and has a thickness of 20 to 50 µm. The connection terminals 11 are formed directly on the film substrate 13 and arranged so as to be aligned with the connection electrodes 12 when the semiconductor chip 20 is mounted on the film substrate 13. The reinforcing part 11b of each connection terminal 11 is located at the center part of the semiconductor chip 20. The main part 11a of each connection terminal 11, which includes the electrode-connecting part 11c, extends from the reinforcing part 11b to one long-side edge of the film substrate 13. It should be noted that the electrode-connecting part 11c is aligned with one connection electrode 12 of the semiconductor chip 20. That is, each connection electrode 12 of the chip 20 is bonded to the electrode-connecting part 11c of one connection terminal 11. The electrode-connecting part 11c is located near the reinforcing part 11b of the connection terminal 11. The distal end portion of each connection terminal 11 is firmly adhered to the film substrate 13, by virtue of the reinforcing part 11b. Hence, the connection terminals 11 hardly peel from the film substrate 13.

To incorporate the flexible wiring board 10 (i.e., the first embodiment) into a liquid crystal display, it suffices to connect the connection terminals 11 arranged at one long-side edge of the film substrate 13 to the liquid display panel, and to connect the connection terminals arranged on the other long-side edge of the film substrate 13 to the control circuit substrate. In this case, fewer connection terminals 11 are connected to the control circuit substrate than to the liquid display panel. The terminals 11 connected to the control circuit substrate can therefore be arranged at a longer pitch and can be broader than the terminals 11 connected to the liquid display panel. Hence, the connection terminals 11 connected to the control circuit substrate may not have a reinforcing part 11b, whereas only the terminals 11 connected to the liquid crystal panel have a reinforcing part 11b.

Figure 4:
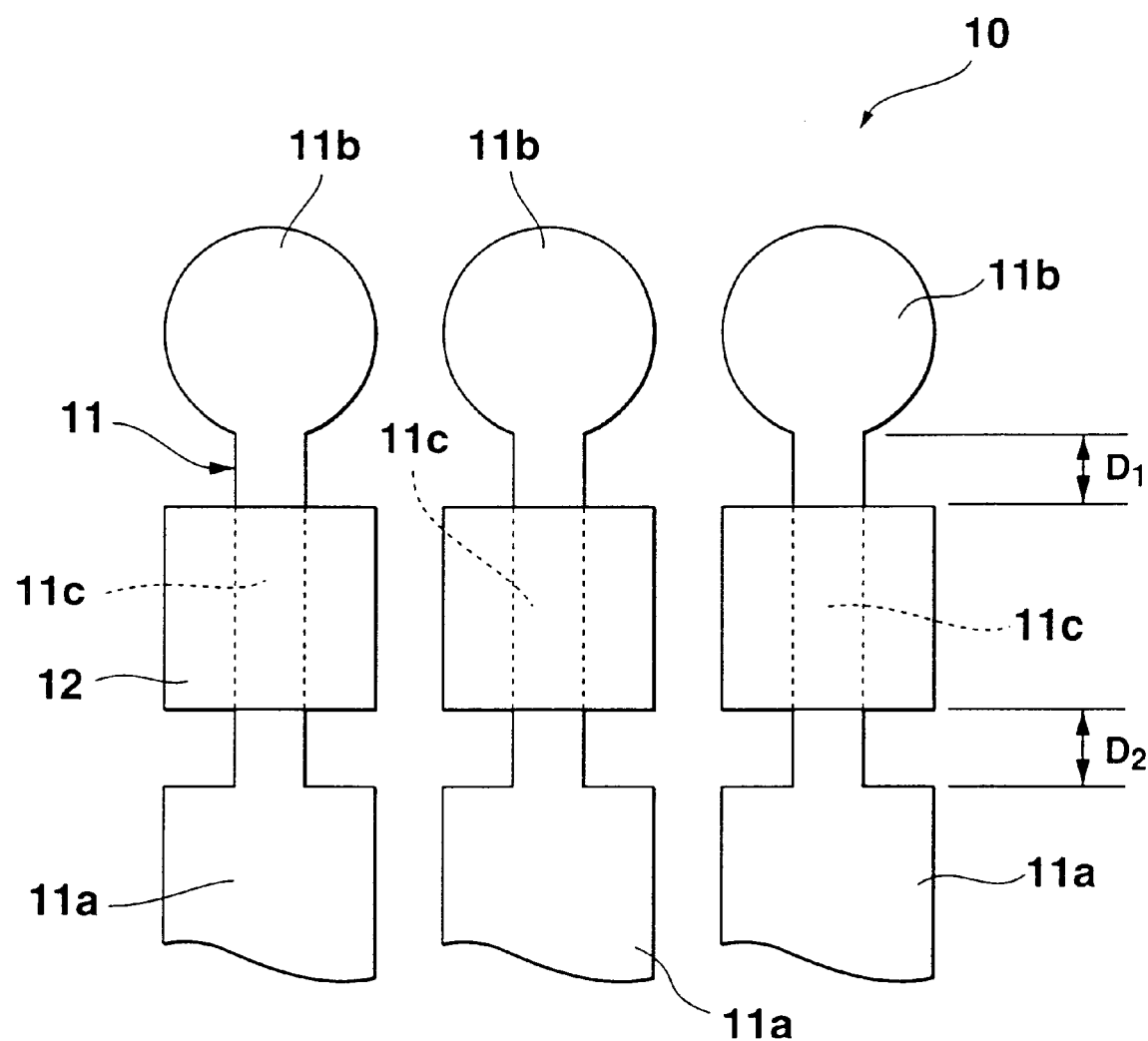
FIG. 4 is a magnified plan view showing a terminal structure according to the second embodiment of the invention, to which a semiconductor chip is bonded, and illustrating the position relation between the connection terminals provided on the upper surface of a film substrate and the connection electrodes provided on the lower surface of the semiconductor chip.

FIG. 4 shows the second embodiment of the present invention. In the second embodiment, only the electrode-connecting part 11c of every connection terminal 11 is thinner than the other parts. The main part 11a is as broad as the side length of the connection electrodes 12. Assume that the precision of bonding the semiconductor chip to the flexible wiring board 10 is ±A in this case. Then, it is necessary to prevent each connection terminal 11 from being displaced not only leftward or rightward, but also upward or downward, from one connection electrode 12 (as in the structure shown in FIG. 1). FIG. 4 illustrates a desirable positional relation between the connection terminals 11 and the connection electrodes 12. In this arrangement, the distance D1 between each connection electrode 12 and the reinforcing part 11b of the connection terminal 11 is equal to or greater than A (an absolute value of the precision of bonding the semiconductor chip to the film substrate), and the distance D2 between the electrode 12 and the main part 11a of the terminal 11 is also equal to or greater than A. Therefore, each connection terminal 11 can be prevented from being displaced leftward or rightward from one connection electrode 12.

Figure 5:
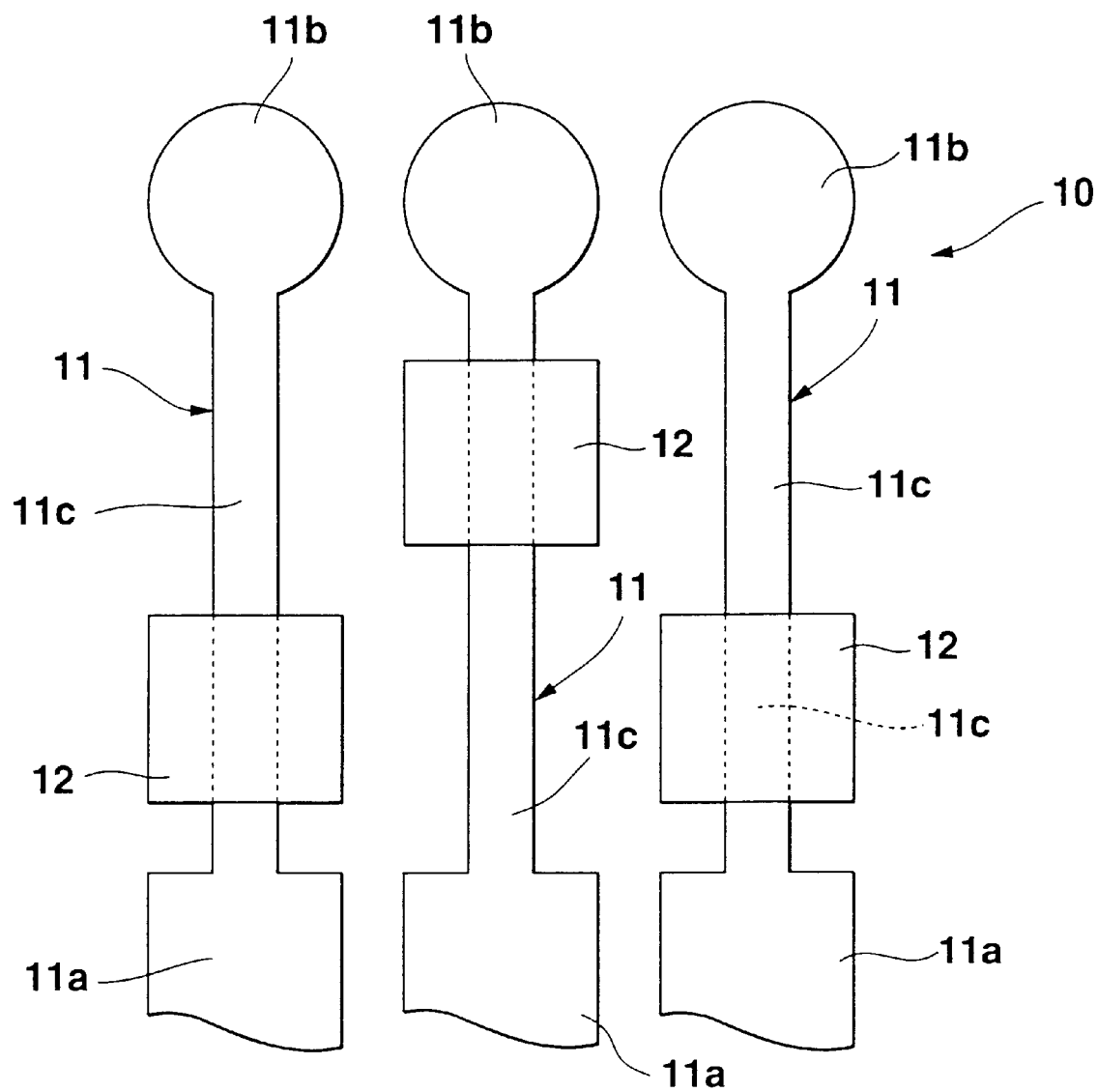
FIG. 5 is a magnified plan view showing a terminal structure according to the third embodiment of the invention and illustrating the position relation between connection terminals provided on the upper surface of a film substrate and connection electrodes provided on the lower surface of a semiconductor chip.

FIG. 5 shows a terminal structure according to the third embodiment of the invention. In the third embodiment, the connection electrodes 12 are provided in two rows on the lower surface of the semiconductor chip. The electrodes 12 of the first row are staggered with respect to those of the second row. In other words, any connection electrode 12 of one row does not exist between two adjacent connection electrodes 12 of the other row. That is, the first and second rows are not aligned, but are parallel with each other. The electrode-connecting part 11c of each connection terminal 11 is longer than in the second embodiment (FIG. 4) so that it may lie below both rows of connection electrodes 12. The main part 11a of each connection terminal has almost the same length as the connection electrodes 12. Since the connection electrodes 12 are arranged in two rows, each does not overlap any other. Further, the electrode-connecting part 11c of each connection terminal 11 is longer than the connection electrodes 12 are broad. Hence, the electrode-connecting part 11c of any connection terminal 11 would not be short-circuited to any adjacent connection electrode 12.

In the third embodiment, the electrode-connecting part 11c of every connection terminal 11, which is not bonded to the connection electrode 12, may be made as broad as the reinforcing part 11b.

Moreover, the reinforcing part 11b of each connection terminal 11 may have a diameter (maximum width) larger than the length width of the main part 11a and less than the side length (width) of the connection electrode 12. Further, the main part 11a may have a width larger than the width of the electrode-connecting part 11c and smaller than the side length of the connection electrode 12.

Figure 6A:
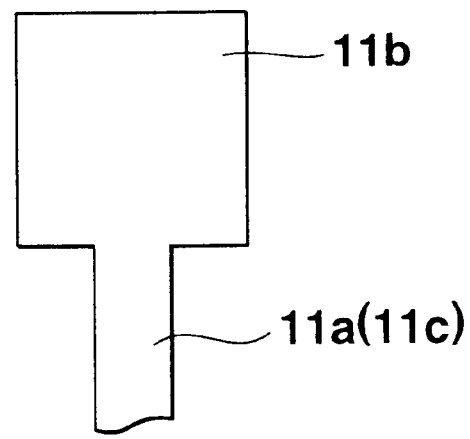
FIGS. 6A to 6C are plan views depicting the reinforcing parts of three different types of connection electrodes, each provided on a film substrate.
Figure 6B:
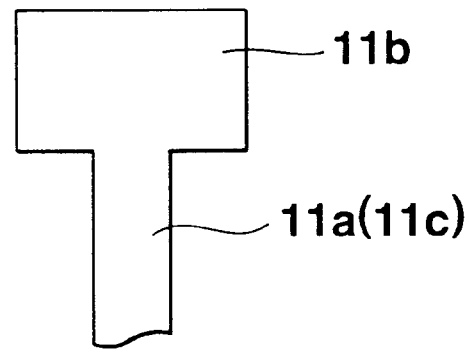
Figure 6C:
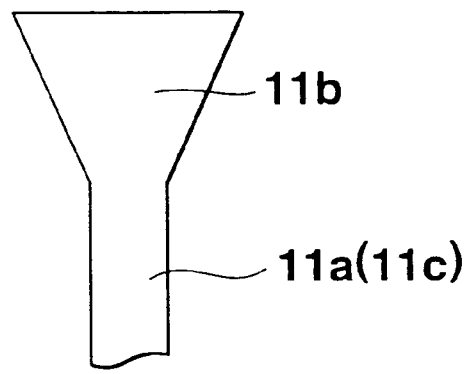

In each of the embodiments described above, the reinforcing parts 11b are not limited to circular ones. Rather, they may be square ones shown in FIG. 6A, rectangular ones shown in FIG. 6B, or trapezoidal ones shown in FIG. 6C. In addition, the connection electrodes 12 are not limited to square ones; they may be rectangular, circular or of any other shape.

Figure 7:
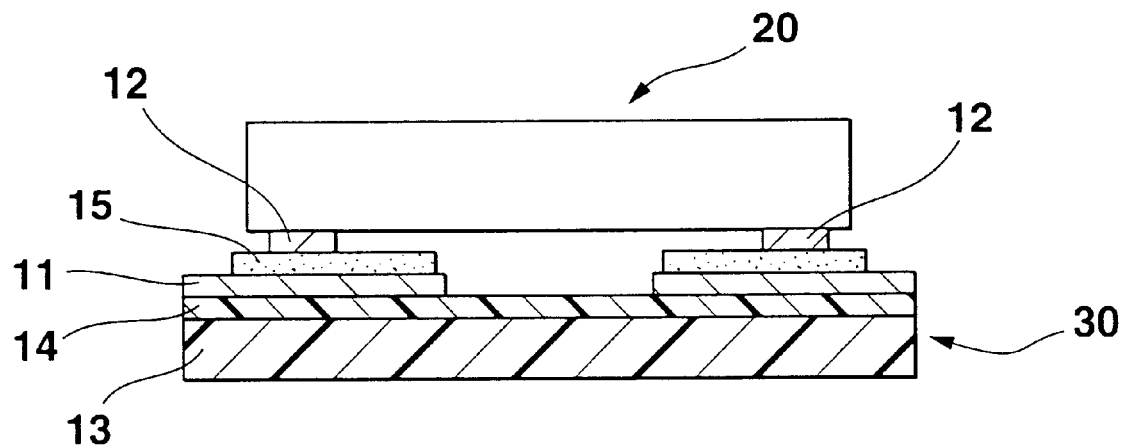
FIG. 7 is a sectional view showing the semiconductor chip bonded to the film substrate in another manner.
Figure 8:
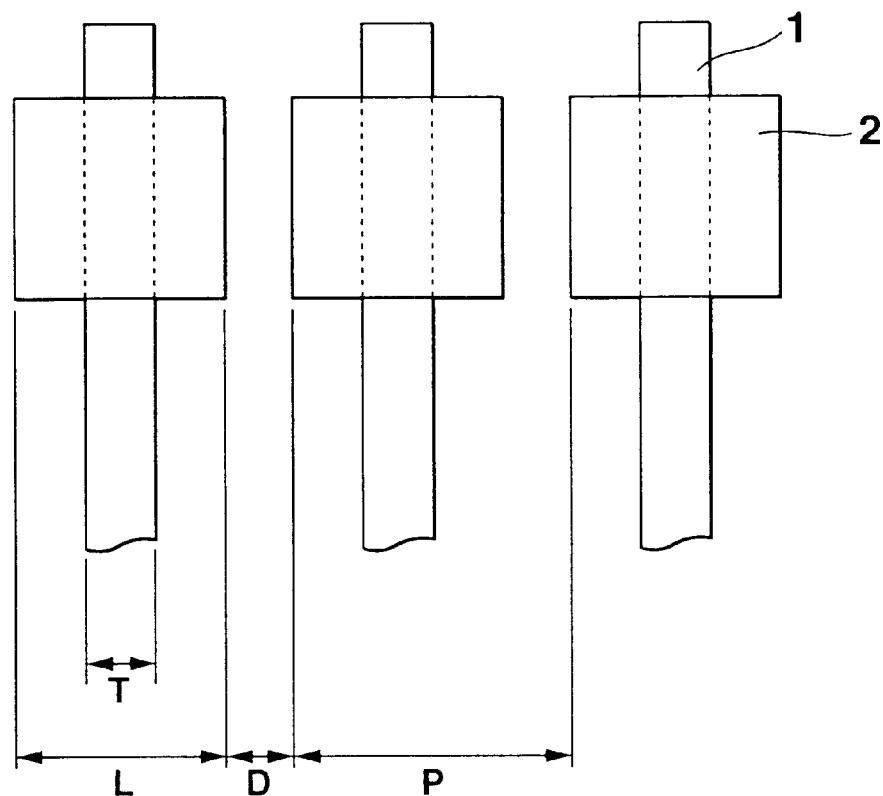
FIG. 8 is a plan view showing a conventional flexible wiring board and illustrating the positional relation between connection terminals provided on the upper surface of a film substrate and connection electrodes provided on the lower surface of a semiconductor chip.

FIG. 7 shows another embodiment of the invention, more precisely a structure in which a semiconductor chip 20 is connected to a flexible wiring board 30. In this embodiment, the connection terminals 11 are adhered to the film substrate 13 with adhesive 14. The connection electrodes 12 of the semiconductor chip 20 are bonded to the connection terminals 11 by an anisotropic, electrically conductive adhesive 15.

In any embodiment described above, the connection terminals are formed on a film substrate that can be easily bent. Nevertheless, the connection terminals may be provided on a semiconductor substrate or a substrate made of hard insulating material such as epoxy resin, epoxy resin containing glass fibers, ceramic or the like. The electronic component to be bonded to the connection terminals is not limited to a semiconductor chip. It may be a semiconductor device (having a semiconductor chip) such as a CSP (Chip Size Package) or a BGA (Ball Grid Array) or any other electronic component other than semiconductor chips.

As has been described, the terminal structure according to the present invention comprises connection terminals, each comprising an electrode-connecting part and a reinforcing part broader than the electrodeconnecting part. The reinforcing part therefore hardly peels from the film substrate even if the width of the electrode-connecting part is reduced to some extent. This helps to arrange the connection terminals at shorter pitch, thereby to accomplish fine pitching.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A terminal structure comprising:

a substrate; and a plurality of connection terminals arranged on the substrate at a predetermined pitch, wherein each of said connection terminals includes:
   (i) an electrode-connecting part having a width,
   (ii) a reinforcing part provided near the electrode-connecting part and having a maximum width greater than the width of the electrode-connecting part, and
   (iii) a main part having the same width as the electrode-connecting part, and wherein the reinforcing part, the electrode-connecting part, and the main part are connected in order.

2. A terminal structure according to claim 1, wherein the reinforcing part is located at a distal end of each connection terminal.

3. A terminal structure according to claim 1, wherein the substrate is a film substrate.

4. A terminal structure according to claim 1, wherein the width of the electrode-connecting part is less than a maximum width of a connection electrode to be connected to the electrode-connecting part.

5. A terminal structure according to claim 4, wherein the reinforcing part is substantially circular.

6. A terminal structure comprising:

a substrate;

a plurality of connection terminals arranged on the substrate at a pitch; and an electronic component having connection electrodes, wherein each of said connection terminals includes:
   (i) an electrode-connecting part to which a respective one of the connection electrodes of the electronic component is to be connected, said electrode-connecting part having a width less than a maximum width of the connection electrode to be connected thereto,
   (ii) a reinforcing part provided near the electrode-connecting part and having a maximum width greater than the width of the electrode-connecting part, and
   (iii) a main part to which the electrode-connecting part is connected and having the same width as the electrode-connecting part.

7. A terminal structure according to claim 6, wherein the reinforcing part is located at a distal end of each connection terminal.

8. A terminal structure according to claim 6, wherein the substrate is a film substrate.

9. A terminal structure comprising:

a substrate;

a plurality of connection terminals arranged on the substrate at a pitch; and a rectangular semiconductor chip having connection electrodes provided on at least two opposing edges and arranged in two rows on at least one edge to be connected to the connection terminals, respectively, wherein the connection terminals are arranged along at least one side of the semiconductor chip, wherein each of the connection terminals includes:
   (i) an electrode-connecting part to be connected to a corresponding one of the connection electrodes of the semiconductor chip, and
   (ii) a reinforcing part provided near the electrode-connecting part and having a maximum width greater than a width of the electrode-connecting part, and
      wherein the reinforcing part and the electrode-connecting part are provided on a lower surface of the semiconductor chip.

10. A terminal structure according to claim 9, wherein the electrode-connecting part has a width less than a maximum width of the connection electrode.

11. A terminal structure according to claim 9, wherein the reinforcing part is circular.

12. A terminal structure comprising:
a substrate; and
a plurality of connection terminals arranged on the substrate at a predetermined pitch,
wherein each of the connection terminals includes:
(i) an electrode-connecting part having a width,
(ii) a reinforcing part provided near the electrode-connecting part and having a maximum width greater than the width of the electrode-connecting part, and
(iii) a main part having a width greater than the width of the electrode-connecting part, and
wherein the reinforcing part, the electrode-connecting part, and the main part are connected in order.

13. The terminal structure according to claim 12, wherein the reinforcing part is located at a distal end of each connection terminal.

14. The terminal structure according to claim 12, wherein the substrate is a film substrate.

15. The terminal structure according to claim 12, wherein the width of the electrode-connecting part is less than a maximum width of the connection electrode to be connected to the electrode-connecting part.

16. A terminal structure comprising:
a substrate; and
a plurality of connection terminals arranged on the substrate at a pitch; and
an electronic component having connection electrodes,
wherein each of said connection terminals includes:
(i) an electrode-connecting part to which a respective one of the connection electrodes of the electronic component is to be connected, said electrode connecting part having a width less than a maximum width of the connection electrode to be connected thereto,
(ii) a reinforcing part provided near the electrode-connecting part and having a maximum width greater than the width of the electrode-connecting part, and
(iii) a main part to which the electrode-connecting part is connected and having a width greater than the width of the electrode-connecting part.

17. The terminal structure according to claim 16, wherein the reinforcing part is located at a distal end of each connection terminal.

18. The terminal structure according to claim 16, wherein the substrate is a film substrate.

19. A terminal structure comprising:
a flexible wiring board having a film substrate and a plurality of connection terminals; and
a semiconductor chip having connection electrodes provided on at least two opposing edges on a lower surface thereof,
wherein each of said connection terminals includes:
(i) an electrode-connecting part to be connected to a respective one of the connection electrodes of the semiconductor chip,
(ii) a reinforcing part provided near the electrode-connecting part and having a maximum width greater than a width of the electrode-connecting part, and
(iii) a main part connected to the electrode-connecting part,
wherein the electrode-connecting part and the reinforcing part are provided below the semiconductor chip; and
wherein the reinforcing part is located at a distal end of one of the connection terminals, and the main part is formed outside the semiconductor chip.

20. The terminal structure according to claim 19, wherein the flexible wiring board has a two-layer structure, and the plurality of connection terminals are directly formed on the film substrate.

21. The terminal structure according to claim 19, wherein the width of the electrode-connecting part is less than a width of the connection electrode to be connected thereto.

* * * * *